United States Patent
Hoya et al.

(10) Patent No.: US 7,408,824 B2
(45) Date of Patent: Aug. 5, 2008

(54) FERROELECTRIC MEMORY WITH SPARE MEMORY CELL ARRAY AND ECC CIRCUIT

(75) Inventors: Katsuhiko Hoya, Yokohama (JP); Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/668,706

(22) Filed: Jan. 30, 2007

(65) Prior Publication Data

US 2008/0034253 A1    Feb. 7, 2008

(30) Foreign Application Priority Data

Aug. 1, 2006  (JP)  ............... 2006-210212

(51) Int. Cl.
G11C 29/00    (2006.01)
(52) U.S. Cl. .................. 365/200; 365/189.07
(58) Field of Classification Search .................. 365/200
See application file for complete search history.

(56) References Cited

U.S. PATENT DOCUMENTS

| | | | |
|---|---|---|---|
| 6,262,925 B1 * | 7/2001 | Yamasaki ................... | 365/200 |
| 6,549,460 B2 | 4/2003 | Nozoe et al. | |
| 7,212,453 B2 * | 5/2007 | Kikutake et al. ............ | 365/200 |
| 2002/0184592 A1 * | 12/2002 | Koga et al. .................. | 714/763 |
| 2008/0034270 A1 * | 2/2008 | Onishi et al. ................ | 714/758 |

FOREIGN PATENT DOCUMENTS

| JP | 2001-143478 | 5/2001 |
|---|---|---|
| JP | 2001-250376 | 9/2001 |

OTHER PUBLICATIONS

U.S. Appl. No. 11/397,572, filed Apr. 5, 2006, Hoya et al.
U.S. Appl. No. 11/668,706, filed Jan. 30, 2007, Hoya et al.

* cited by examiner

*Primary Examiner*—Son L Mai
(74) *Attorney, Agent, or Firm*—Oblon, Spivak, McClelland, Maier & Neustadt, P.C.

(57) ABSTRACT

A semiconductor memory comprising a memory cell array, a spare memory cell array, a spare data replacing circuit, a syndrome computing circuit, and an ECC circuit is disclosed. The data in the memory cell replaced with a memory cell in the spare memory cell array is set to 0 and then the syndromes of the data read from the memory cell array are calculated. In parallel with the syndrome calculation, the data in the memory cell of the memory cell array is replaced with the data read from a spare memory cell. Then, the syndromes of the data read from the memory cell in the spare memory cell array are calculated. The calculated syndromes and the output of the spare data replacing circuit are supplied to the ECC circuit, which corrects the error if there is a 1-bit error in the data read from the memory cell array.

15 Claims, 8 Drawing Sheets

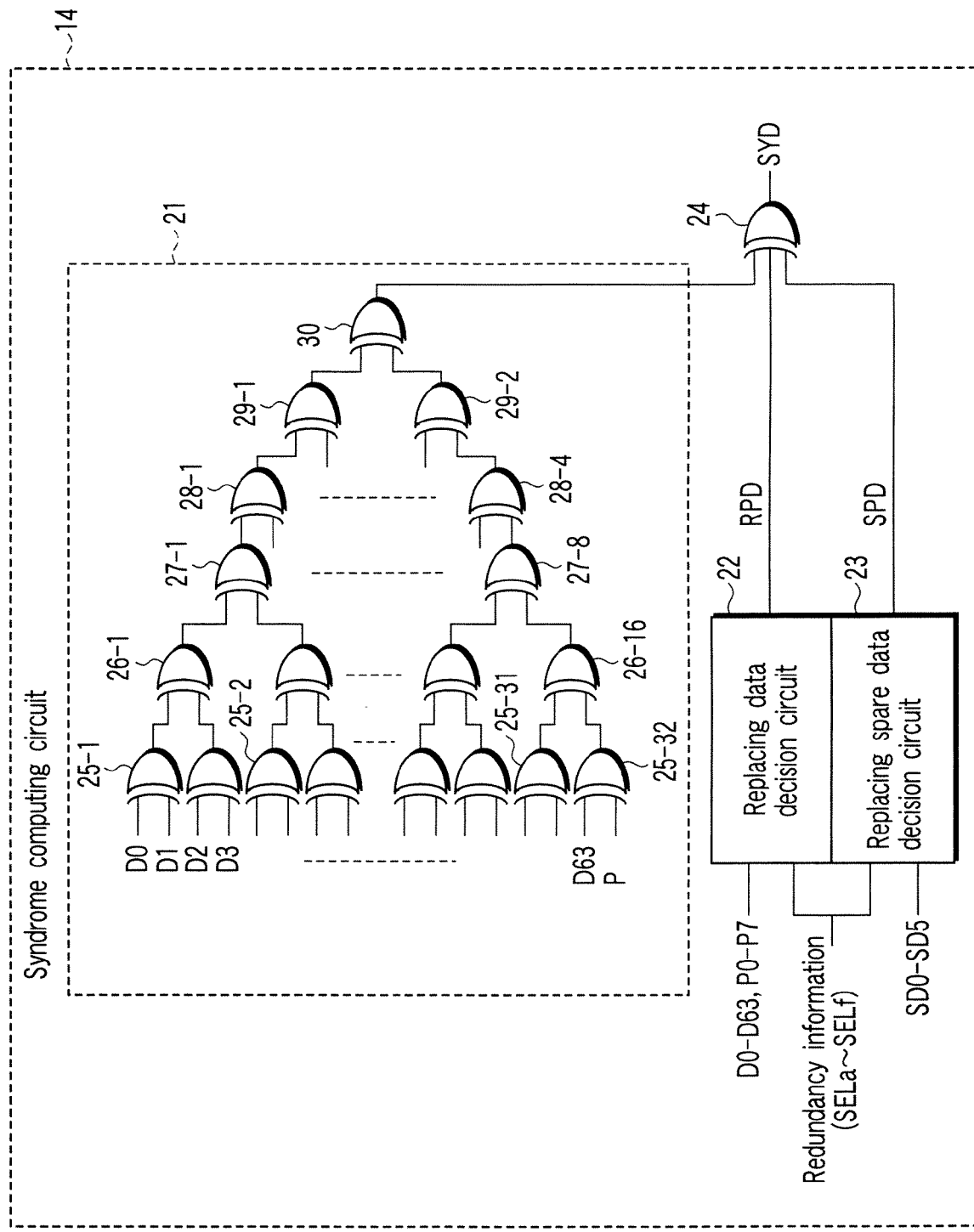
F I G. 2

FIG. 5

|     | 0 | 1 | 2 | 3 | 4 | 5 | 6 | 7 |
|-----|---|---|---|---|---|---|---|---|
| Sy7 |   |   |   | 1 |   |   | 1 | 1 |
| Sy6 |   |   | 1 |   |   | 1 | 1 |   |
| Sy5 |   | 1 |   |   | 1 | 1 |   |   |
| Sy4 | 1 |   |   | 1 | 1 |   |   |   |
| Sy3 |   |   |   |   |   |   |   |   |
| Sy2 |   |   |   |   |   |   |   |   |
| Sy1 |   |   |   |   |   |   |   |   |
| Sy0 | 1 | 1 | 1 | 1 | 1 | 1 | 1 | 1 |

|     | D012 | D123 | D234  | D345  | D456  | D567  |
|-----|------|------|-------|-------|-------|-------|
| SY4 | D0   | D3   | D3+D4 | D3+D4 | D4    |       |
| SY5 | D1   | D1   | D4    | D4+D5 | D4+D5 | D5    |
| SY6 | D2   | D2   | D2    | D5    | D5+D6 | D5+D6 |
| SY7 |      | D3   | D3    | D3    | D6    | D6+D7 |

D32–D63

|     | D012 | D123 | D234  | D345  | D456  | D567  |
|-----|------|------|-------|-------|-------|-------|
| SY4 | D0   | D3   | D3+D4 | D3+D4 | D4    |       |
| SY5 | D1   | D1   | D4    | D4+D5 | D4+D5 | D5    |
| SY6 | D2   | D2   | D2    | D5    | D5+D6 | D5+D6 |
| SY7 |      | D3   | D3    | D3    | D6    | D6+D7 |

FIG. 8

FERROELECTRIC MEMORY WITH SPARE MEMORY CELL ARRAY AND ECC CIRCUIT

CROSS-REFERENCE TO RELATED APPLICATIONS

This application is based upon and claims the benefit of priority from prior Japanese Patent Application No. 2006-210212, filed Aug. 1, 2006, the entire contents of which are incorporated herein by reference.

BACKGROUND OF THE INVENTION

1. Field of the Invention

This invention relates to a semiconductor memory device, and more particularly to a ferroelectric memory which stores binary data in a nonvolatile manner by using two different magnitudes of polarizations of a ferroelectric substance on the basis of the fact that spontaneous polarization, one of the properties of a ferroelectric substance, presents a hysteresis characteristic.

2. Description of the Related Art

A ferroelectric memory stores binary data in a nonvolatile manner by using two different magnitudes of polarizations of a ferroelectric substance on the basis of the fact that spontaneous polarization, one of the properties of a ferroelectric substance, presents a hysteresis characteristic. A memory cell in a conventional ferroelectric memory has generally employed the same architecture as that of a DRAM (refer to, for example, Jpn. Pat. Appln. KOKAI Publication No. 2001-143478 or Jpn. Pat. Appln. KOKAI Publication No. 2001-250376). In the conventional ferroelectric memory, a normal dielectric capacitor is replaced with a ferroelectric capacitor and the ferroelectric capacitor is connected in series with a transistor, thereby configuring a memory cell. A plurality of units of this memory cell are arranged, thereby configuring a memory cell array.

In addition to the memory cell array, a spare memory cell array is provided to remedy defective bits in the memory cell array. If a defective bit has occurred in a block in the memory cell array, the block is replaced with a block in the spare memory cell array. This enables the overhead of the chip area to be minimized and the chip yield to be increased.

Furthermore, providing the chip with an error checking and correcting (ECC) circuit makes it possible to correct the error in the data, when there is an error only in one bit in a plurality of items of data read out. The method with the ECC circuit works on a defective bit from which erroneous data will be read at a certain probability under a specific condition, not on a defective bit which can be neither read from nor written to a cell in the memory cell array. Using this method enables the reliability of read data to be improved.

In a case where the chip is provided with both the spare memory cell array and the ECC circuit, when data replacement is needed using the spare memory cell array, the data in the memory cell array is replaced with the data in the spare memory cell array first. Next, using a syndrome computing circuit, syndromes are calculated from the data in the memory cell array and the data in a part of the spare memory cell array. If there is a 1-bit error, the ECC circuit corrects the error on the basis of the syndrome and the read data and outputs the result. A ferroelectric memory is a nonvolatile memory. Since the ferroelectric memory uses a destructive read operation, the series of operations has to be carried out in a short period from when the data is read onto the data line until the data is written again.

Since the spare memory cell array is generally provided adjacent to the memory cell array, some of the blocks in the memory cell are close to the spare memory cell array and some are far away from the spare memory cell array. The difference in wiring length between a block close to and a block far away from the spare memory cell array is large. When the data read from a memory cell in the block far away from the spare memory cell array is replaced with the data in the spare memory cell array, the time required to replace the data in the memory cell array with the data in the spare memory cell array increases. This results in an increase in the cycle time and an increase in the access time.

BRIEF SUMMARY OF THE INVENTION

According to an aspect of the present invention, there is provided a semiconductor memory device comprising: a memory cell array which includes a plurality of blocks each having memory cells arranged in a matrix and which has a ferroelectric capacitor one electrode of which is connected to a plate line and a transistor whose drain terminal is connected to the other electrode of the ferroelectric capacitor, whose gate terminal is connected to a word line, and whose source terminal is connected to a bit line; a spare memory cell array which is for replacing a block including a defective bit in the memory cell array;

a syndrome computing circuit which is supplied with redundancy information and is controlled and to which data read from the memory cell array, data read from the spare memory cell array, and parity bits read from the memory cell array are input and which is configured to calculate syndromes; a spare data replacing circuit which is configured to carry out the operation of replacing the data read from the memory cell array with the data read from the spare memory cell array in parallel with the syndrome calculation; and an error checking and correcting circuit to which the syndromes calculated at the syndrome computing circuit and the data replaced at the spare data replacing circuit are input and which is configured to correct the error if an error has occurred in a plurality of items of data read, wherein the syndrome computing circuit calculates the syndromes of the data read from the memory cell array, replaces the data read from the memory cell array with the data read from the spare memory cell in parallel with the syndrome calculation, and calculates the syndromes of the data read from the memory cell in the spare memory cell array, and when the syndromes of the data read from the memory cell array are calculated at the syndrome computing circuit, an input from the spare data replacing circuit to the error checking and correcting circuit is set to a level uninvolved in the output of the syndrome computing circuit.

According to another aspect of the present invention, there is provided a semiconductor memory device comprising: a memory cell array which includes a plurality of blocks each having memory cells arranged in a matrix, each memory cell having a ferroelectric capacitor one electrode of which is connected to a plate line and a transistor whose drain terminal is connected to the other electrode of the ferroelectric capacitor, whose gate terminal is connected to a word line, and whose source terminal is connected to a bit line; a spare memory cell array which is for replacing a block including a defective bit in the memory cell array; a spare data replacing circuit which is configured to carry out the operation of replacing the data read from the memory cell array with the data read from the spare memory cell array; a syndrome computing circuit which is supplied with redundancy information and is controlled and to which the data and parity bits read from the memory cell array and the data read via the spare data replacing circuit from the spare memory cell array are input and which is configured to calculate syndromes; and an error checking and correcting circuit to which the syndromes calculated at the syndrome computing circuit and the data replaced at the spare data replacing circuit are input and which is configured to correct the error if an error has occurred in a plurality of items of data read, wherein the syndrome computing circuit calculates a syndromes of the data read from the memory cell array and then recalculate the syndromes of the data read from the memory cell in the spare memory cell array.

According to still another aspect of the present invention, there is provided a semiconductor memory device comprising: a memory cell array which includes a plurality of blocks each having memory cells arranged in a matrix, each memory cell having a ferroelectric capacitor one electrode of which is connected to a plate line and a transistor whose drain terminal is connected to the other electrode of the ferroelectric capacitor, whose gate terminal is connected to a word line, and whose source terminal is connected to a bit line; a spare memory cell array which is for replacing a block including a defective bit in the memory cell array; a spare cell syndrome computing circuit to which the data read from the spare memory cell array is supplied and which is configured to calculate the syndromes of the spare memory cell; a syndrome computing circuit to which the data and parity bits read from the memory cell array and the syndromes output from the spare cell syndrome computing circuit are input, and which is configured to calculate syndromes; a spare data replacing circuit which is configured to carry out the operation of replacing the data read from the memory cell array with the data read from the spare memory cell array in parallel with the syndrome calculation; and an error checking and correcting circuit to which the syndromes calculated at the syndrome computing circuit and the data replaced at the spare data replacing circuit are input and which is configured to correct the error if an error has occurred in a plurality of items of data read.

BRIEF DESCRIPTION OF THE SEVERAL VIEWS OF THE DRAWING

FIG. 2 is a circuit diagram showing an example of the configuration of the syndrome computing circuit in the circuit of FIG. 1;

FIG. 5 is a conceptual diagram of a check matrix for the semiconductor memory device according to the first embodiment;

FIG. 7 is a diagram showing recognition code in the case of 8-bit data;

FIG. 8 is a diagram showing data in a memory cell whose data error checking and correcting signal is switched when the memory cell has been replaced with a spare cell;

DETAILED DESCRIPTION OF THE INVENTION

Figure 1:
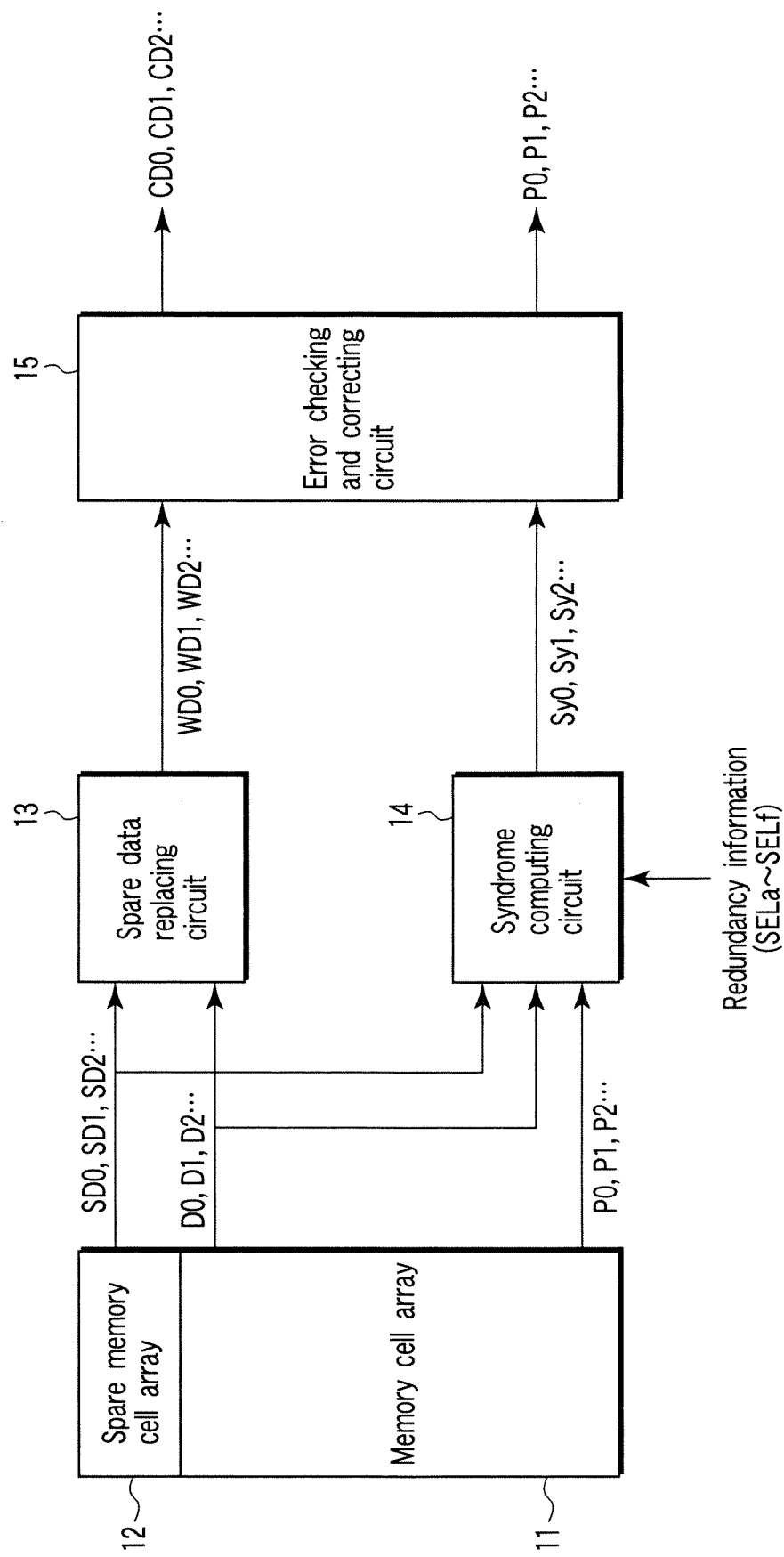
FIG. 1 is a schematic diagram showing an example of the configuration of a part of a ferroelectric memory to help explain a semiconductor memory device according to a first embodiment of the present invention.

FIG. 1 is a schematic diagram showing an example of the configuration of a part of a ferroelectric memory to help explain a semiconductor memory device according to a first embodiment of the present invention. The ferroelectric memory comprises a memory cell array 11, a spare memory cell array 12, a spare data replacing circuit 13, a syndrome computing circuit 14, and an error checking and correcting (ECC) circuit 15.

The memory cell array 11 is divided into a plurality of blocks. In each block, memory cells each of which is composed of a ferroelectric capacitor and a transistor are arranged in a matrix. One electrode of the ferroelectric capacitor is connected to a plate line and the other electrode is connected to the drain terminal of the transistor. The transistor has its gate terminal connected to a word line and its source terminal connected to a bit line.

The spare memory cell array 12 has the same configuration as that of the memory cell array 11. If a defective bit has occurred in a block in the memory cell array 11, it is replaced with a block in the spare memory cell array 12.

Data D0, D1, D2, . . . read from the memory cell array 11, data SD0, SD1, SD2, . . . read from the spare memory cell array 12, and parity bits P0, P1, P2, . . . read from the memory cell array 11 are all supplied to the syndrome computing circuit (or arithmetic circuit) 14. Redundancy information (select signals SELa to SELf) is supplied to the syndrome computing circuit 14, which is controlled by the information. Then, from data D0, D1, D2, . . . , data SD0, SD1, SD2, . . . , and parity bits P0, P1, P2 . . . , syndromes Sy0, Sy1, Sy2, . . . are calculated.

In parallel with the syndrome calculation, the spare data replacing circuit 13 replaces data D0, D1, D2, . . . read from the memory cell array 11 with data SD0, SD1, SD2, . . . read from the spare memory cell array 12. If an error has been detected by the error checking and correcting circuit 15 from syndromes Sy0, Sy1, Sy2, calculated at the syndrome computing circuit 14 and data WD0, WD1, WD2, . . . replaced at the spare data replacing circuit 13, data error corrections are made. Then, correct data CD0, DC1, CD2, . . . after the correction and parity bits P0, P1, P2, . . . are output.

In the semiconductor memory device of the first embodiment, the data in the memory cell replaced with a memory cell in the spare memory cell array 12 is set to 0, the syndromes of data D0, D1, D2, . . . read from the memory cell array 11 are calculated, replacing is done with data SD0, SD1, SD2, . . . read from the spare memory cell in parallel with the syndrome calculation, and thereafter the syndromes of data read from the memory cells in the spare memory cell array 12 are calculated.

The data in the memory cell replaced with a memory cell in the spare memory cell array 12 is not necessarily set to 0. When the syndrome computing circuit 14 calculates the syndromes of the data read from the memory cell array 11, the input from the spare data replacing circuit 13 to the error checking and correcting circuit 15 may be set to a level uninvolved in the output of the syndrome computing circuit 14.

As described above, doing syndrome calculations in parallel with a data replacing operation makes it possible to shorten the time from when the data is read until an error is detected and corrected and the corrected data is output, as compared with the operation of doing syndrome calculations after replacing data D0, D1, D2, . . . read from the memory cell array 11 with data SD0, SD1, SD2, . . . read from the spare memory cell array 12.

FIG. 2 is a circuit diagram showing an example of the configuration of the syndrome computing circuit 14 in the circuit of FIG. 1. The syndrome computing circuit 14 is composed of a syndrome generating circuit 21, a replacing data decision circuit 22, a replacing spare data decision circuit 23, and an exclusive OR circuit 24. The syndrome generating circuit 21 includes 2-input exclusive OR circuits 25-1 to 25-31 to which data D0, D1, D2, D3, . . . , D62 read from the memory cell array 11 are input, a 2-input exclusive OR circuit 25-32 to which data D63 and parity P read from the memory cell array 11 are input, 2-input exclusive OR circuits 26-1 to 26-16 to which the outputs of the 2-input exclusive OR circuits 25-1 to 25-32 are input, 2-input exclusive OR circuits 27-1 to 27-8 to which the outputs of the 2-input exclusive OR circuits 26-1 to 26-16 are input, 2-input exclusive OR circuits 28-1 to 28-4 to which the outputs of the 2-input exclusive OR circuits 27-1 to 27-8 are input, 2-input exclusive OR circuits 29-1, 29-2 to which the outputs of the 2-input exclusive OR circuits 28-1 to 28-4 are input, and a 2-input exclusive OR circuit 30 to which the outputs of the 2-input exclusive OR circuits 29-1, 29-2 are input.

Data D0 to D63 and parity bits P0 to P7 read from the memory cell array 11 and redundancy information (select signals SELa to SELf) are supplied to the replacing data decision circuit 22, which then outputs replaced data.

The redundancy data (select signals SELa to SELf) and data SD0 to SD5 read from the spare memory cell array 12 are supplied to the replacing spare data decision circuit 23, which then outputs spare data.

Then, the output signal of the syndrome generating circuit 21, the replaced data RPD output from the replacing data decision circuit 22, the spare data SPD output from the replacing spare data decision circuit 23 are supplied to the exclusive OR circuit 24. The exclusive OR circuit 24 then outputs syndromes SYD.

Figure 3:
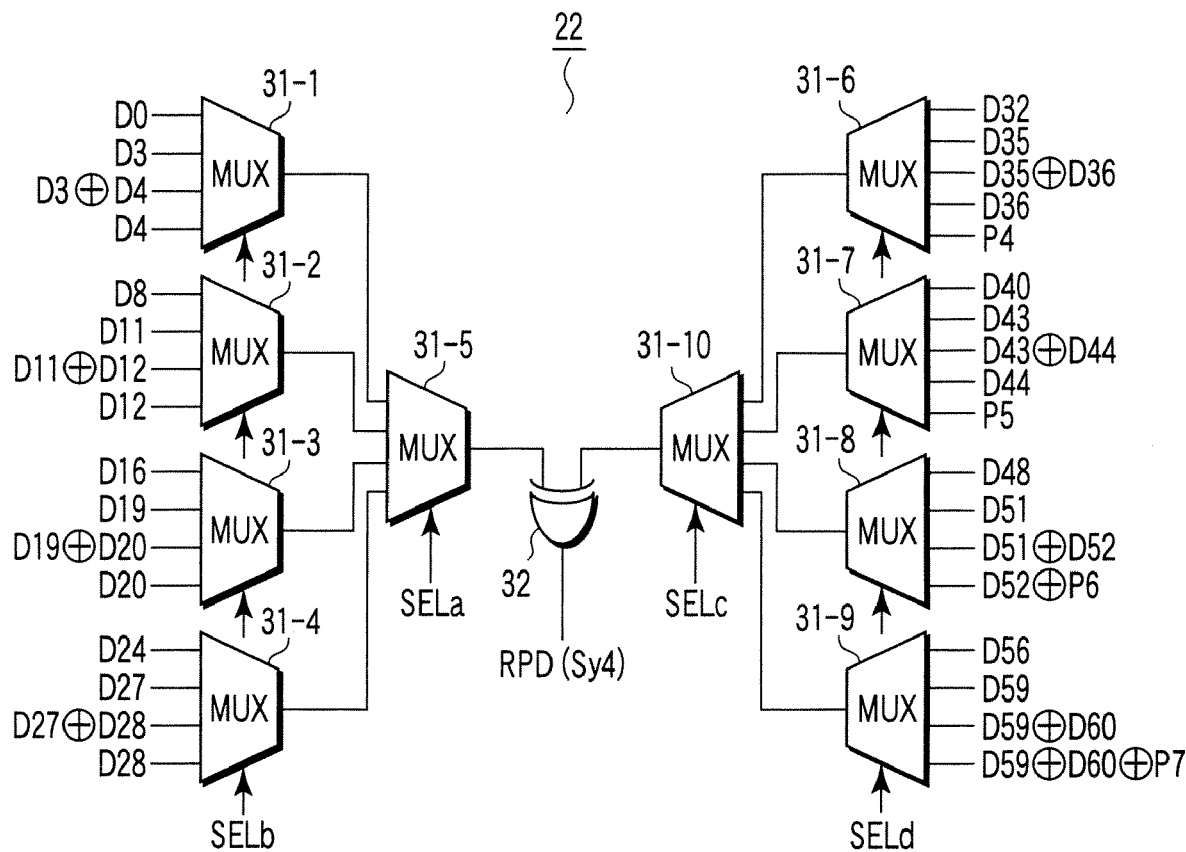
FIG. 3 is a circuit diagram showing a concrete configuration of a replacing data decision circuit in the syndrome computing circuit of FIG. 2.

FIG. 3 is a circuit diagram showing a concrete configuration of a replacing data decision circuit 22 of FIG. 2. The replacing data decision circuit 22 includes multiplexers (MUX) 31-1 to 31-10 and an exclusive OR circuit 32.

Data D0, D3, (D3+D4), D4 read from the memory cell array 11 are supplied to the multiplexer 31-1. Data D8, D11, (D11+D12), D12 read from the memory cell array 11 are supplied to the multiplexer 31-2. Data D16, D19, (D19+D20), D20 read from the memory cell array 11 are supplied to the multiplexer 31-3. Data D24, D27, (D27+D28), D28 read from the memory cell array 11 are supplied to the multiplexer 31-4. Select signal SELb is supplied to these multiplexers 31-1 to 31-4, thereby carrying out a select operation.

The select outputs of the multiplexers 31-1 to 31-4 are supplied to the multiplexer 31-5. Select signal SELa is supplied to the multiplexer 31-5, thereby carrying out a select operation. The output signal of the multiplexer 31-5 is supplied to one input end of the exclusive OR circuit 32.

Data D32, D35, (D35+D36), D36 and parity bit P4 read from the memory cell array 11 are supplied to the multiplexer 31-6. Data D40, D43, (D43+D44), D44 and parity bit P5 read from the memory cell array 11 are supplied to the multiplexer 31-7. Data D48, D51, (D51+D52), (D52+P6) read from the memory cell array 11 are supplied to the multiplexer 31-8. Data D56, D59, (D59+D60), (D59+D60+P7) read from the memory cell array 11 are supplied to the multiplexer 31-9. Select signal SELd is supplied to these multiplexers 31-6 to 31-9, thereby carrying out a select operation.

The select outputs of the multiplexers 31-6 to 31-9 are supplied to the multiplexer 31-10. Select signal SELc is supplied to the multiplexer 31-10, thereby carrying out a select operation. The output signal of the multiplexer 31-10 is supplied to the other input end of the exclusive OR circuit 32. Replaced data PRD (Sy4) is output at the output end of the exclusive OR circuit 32.

The circuit shown in FIG. 3 is for selecting replaced data in the case of syndrome Sy4. FIG. 3 shows a case where three bits in data D0 to D31 are replaced with spare cells and three bits in data D32 to D63 are replaced with spare cells. The select signal SELa selects which eight bits in data D0 to D7, D8 to D15, D16 to D23, D24 to D31 have been replaced and the select signal SELc selects which eight bits in data D32 to D39, D40 to D47, D48 to D55, D56 to D63 have been replaced. Then, the select signals SELb, SELd can select which three bits of the eight bits have been replaced. As described above, giving periodicity to the check matrix in units of eight bits makes it easy to select replaced data.

Figure 4:
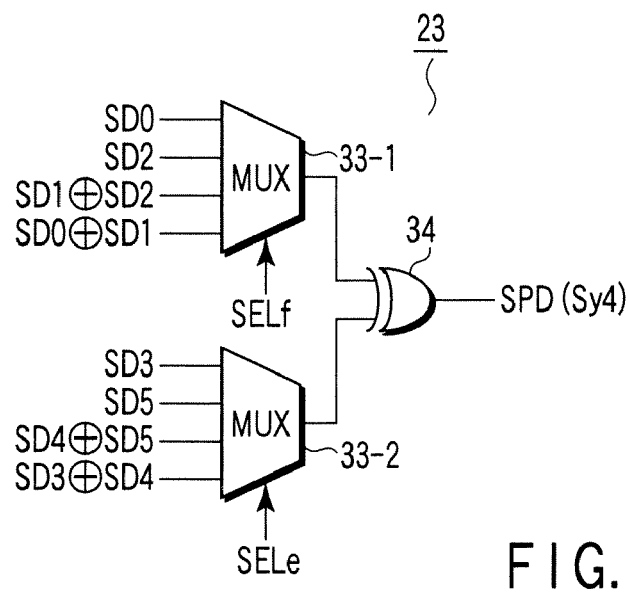
FIG. 4 is a circuit diagram showing a concrete configuration of a replacing spare data decision circuit in the syndrome computing circuit of FIG. 2.

FIG. 4 is a circuit diagram showing a concrete configuration of a replacing spare data decision circuit 23 of FIG. 2. The replacing spare data decision circuit 23 includes multiplexers (MUX) 33-1, 33-2 and an exclusive OR circuit 34. Spare data SD0, SD2, (SD1+SD2), (SD0+SD1) read from the spare memory cell array 12 are supplied to the multiplexer 33-1. Select signal SELf is supplied to the multiplexer 33-1, thereby carrying out a select operation.

Spare data SD3, SD5, (SD4+SD5), (SD3+SD4) read from the spare memory cell array 12 are supplied to the multiplexer 33-2. Select signal SELe is supplied to the multiplexer 33-2, thereby carrying out a select operation.

The output signals of the multiplexers 33-1, 33-2 are supplied to the exclusive OR circuit 34. The exclusive OR circuit 34 outputs spare data SPD (Sy4).

As shown in FIG. 4, as for spare cells, spare cell data is selected, depending on which memory cell has been replaced. In this case, select signal SELf selects which three bits in data D0 to D31 have been replaced and select signal SELe selects which three bits in data D32 to D63 have been replaced.

With the above configuration, a computing operation of the syndrome generating circuit 21 will be schematically explained. In the first embodiment, even when the data in the memory cell array 11 has been replaced with the data in the spare memory cell array 12, the syndrome generating circuit 21 calculates syndromes, beginning with the data read from the memory cell array 11. At this time, the data in the memory cell replaced with the data in the spare memory cell array 12 is set to 0 and then the syndromes of the data read from the memory cell array 11 are calculated. The syndrome generating circuit 21 performs an arithmetical operation on the result of the calculation using the data in the memory cell replaced with the spare memory cell and the data in the spare memory cell, thereby obtaining the final result of syndrome calculations. By doing this, the memory cell data can be replaced with the spare memory cell data in parallel with syndrome calculations, suppressing an increase in the time required for data replacement, which prevents the cycle time and access time from increasing.

Figure 5:
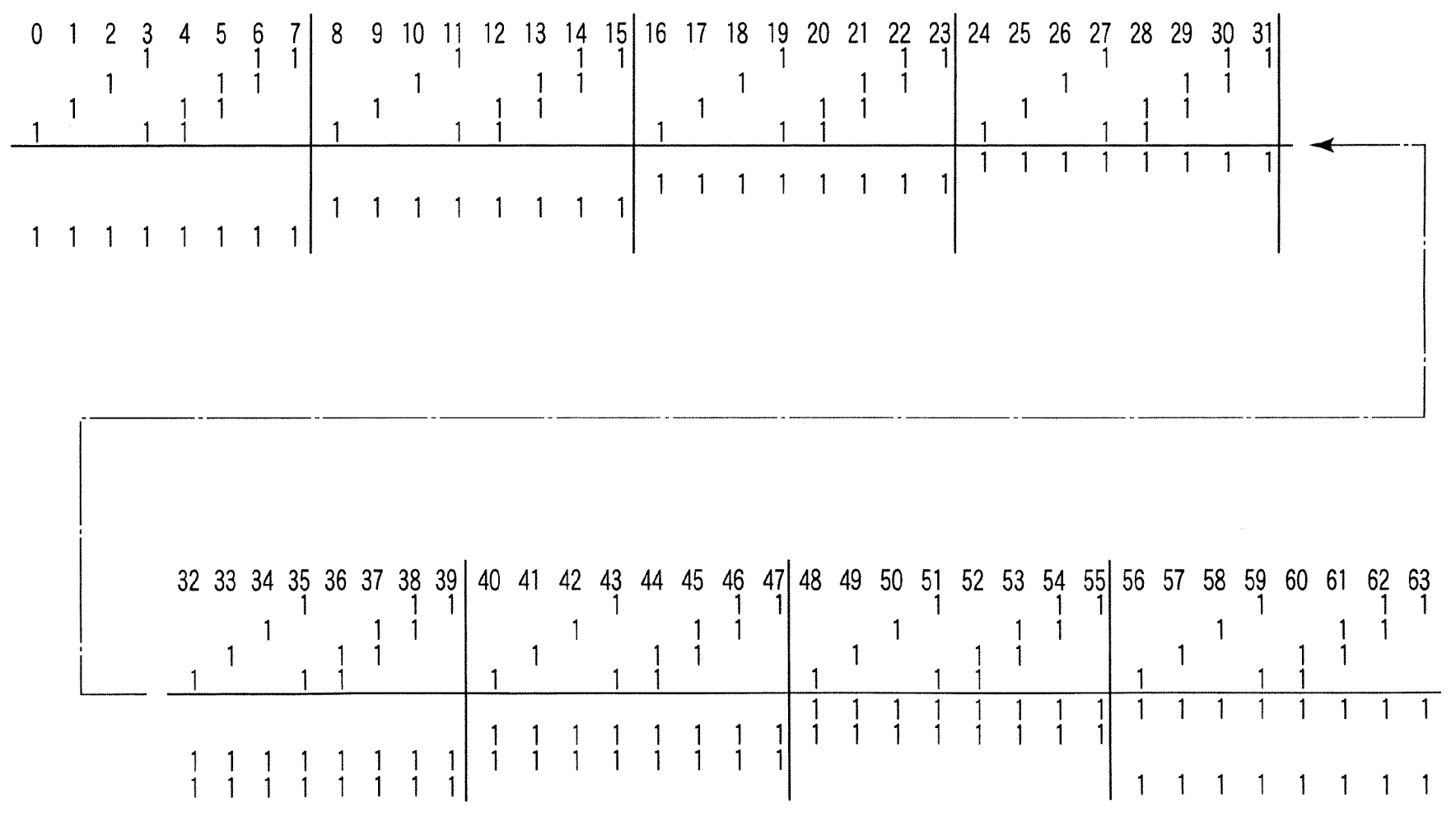
Figure 6:
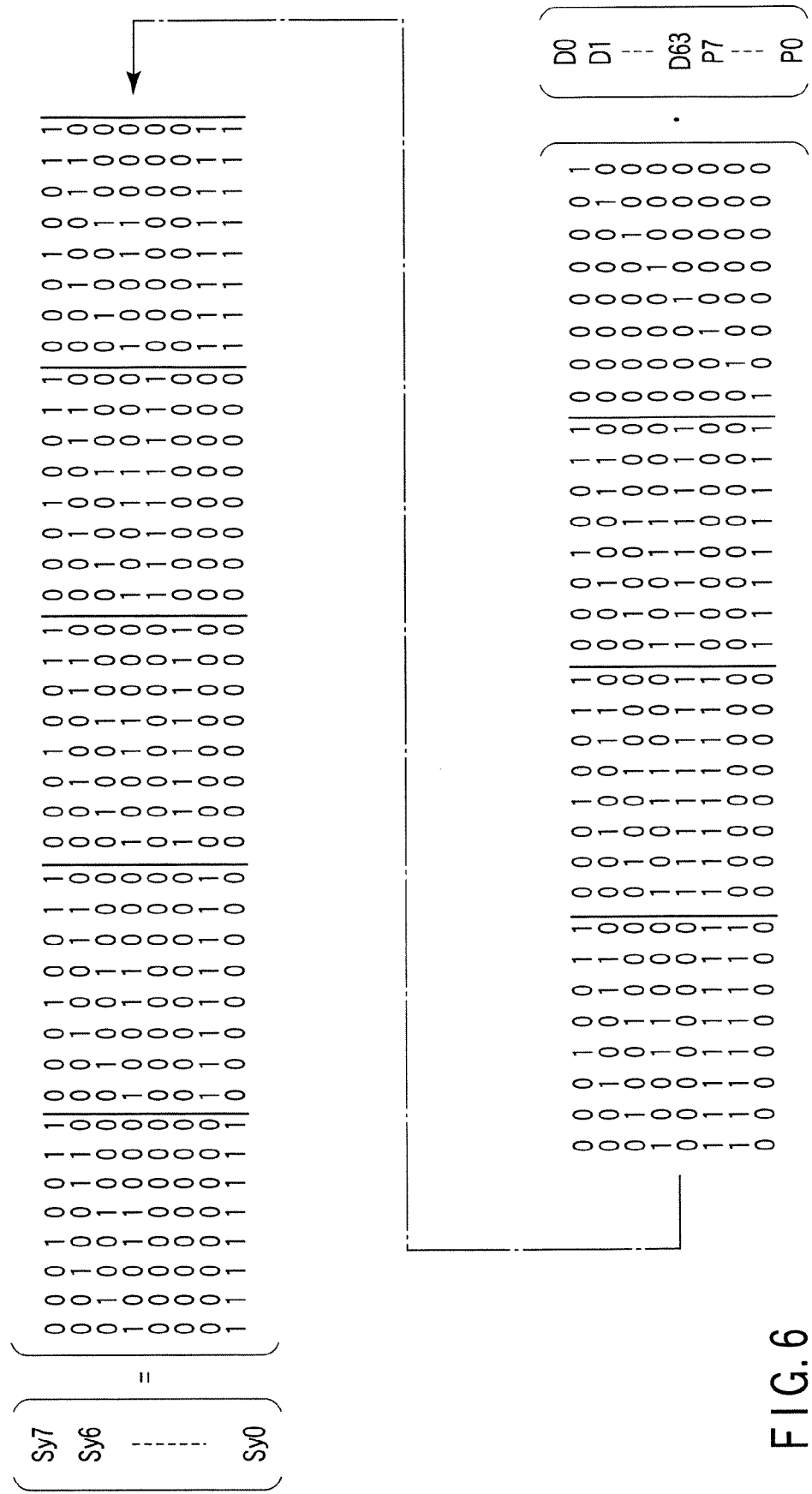
FIG. 6 is a conceptual diagram of syndrome calculations in the semiconductor memory device according to the first embodiment.

FIG. 5 is a conceptual diagram of a check matrix and FIG. 6 is a conceptual diagram of syndrome calculations in the semiconductor memory device according to the first embodiment. Each column in the check matrix represents a recognition code for each item of data. FIG. 5 shows a case where data contains 64 bits (D0 to D63).

FIG. 7 shows recognition codes when data (D0 to D7) contains eight bits. High 4 bits of a recognition code are the same up to 64 bits in units of 8 bits. Low 4 bits are designed to enable 8-bit recognition codes (D0 to D7, D8 to D15, D16 to D23, D24 to D31, D32 to D39, D40 to D47, D48 to D55, D56 to D63) to be distinguished.

FIG. 8 shows data in the memory cells which can be replaced by a data error checking and correcting signal (or syndromes) Sy4 to Sy7 when the memory cells have been replaced with spare cells.

Figure 9:
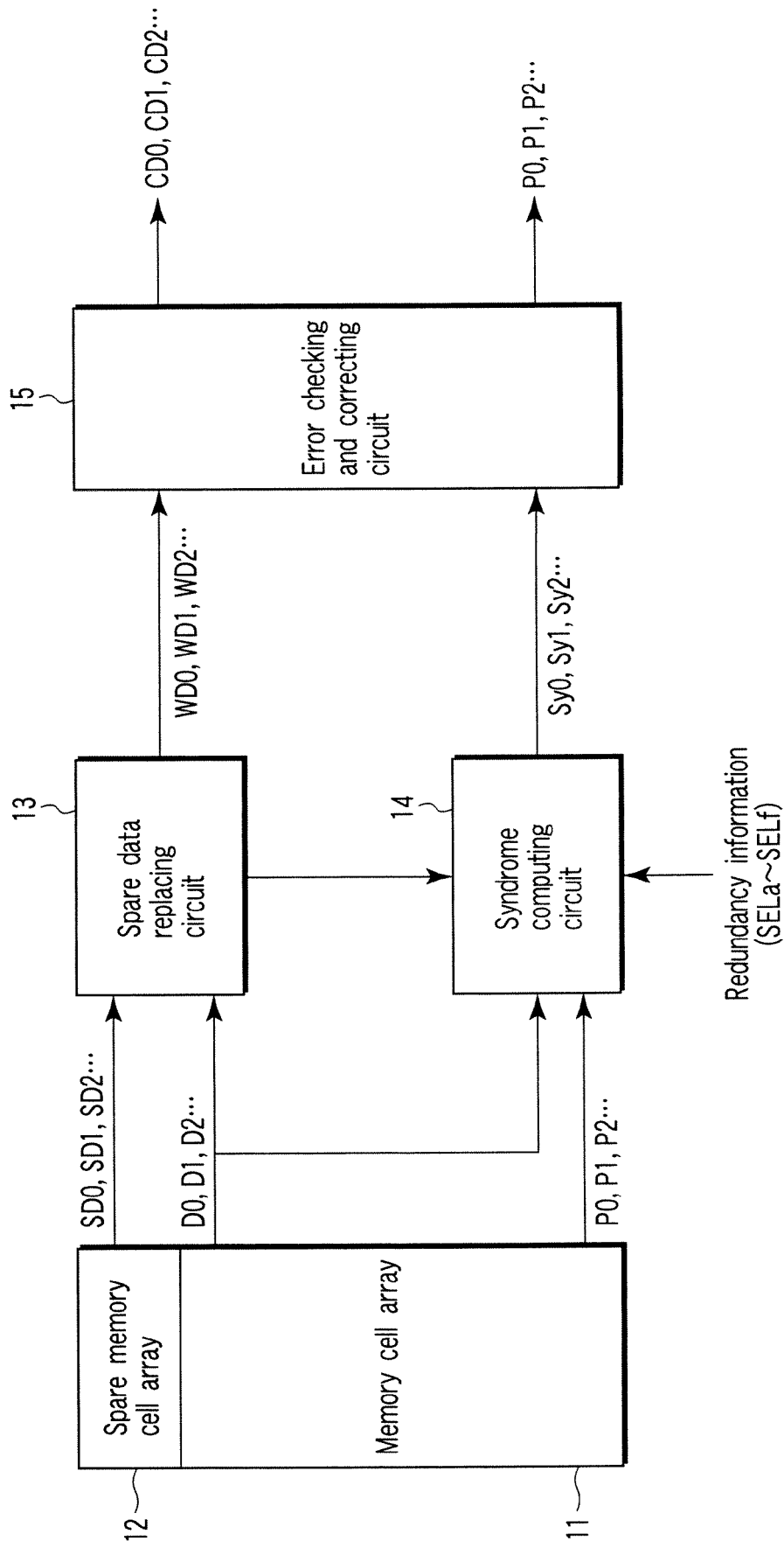
FIG. 9 is a schematic diagram showing an example of the configuration of a part of a ferroelectric memory to help explain a semiconductor memory device according to a second embodiment of the present invention.

FIG. 9 is a schematic diagram showing an example of the configuration of a part of a ferroelectric memory to help explain a semiconductor memory device according to a second embodiment of the present invention. As in the first embodiment, the ferroelectric memory comprises a memory cell array 11, a spare memory cell array 12, a spare data replacing circuit 13, a syndrome computing circuit 14, and an error checking and correcting circuit 15. Data SD0, SD1, SD2, . . . read from the spare memory cell array 12 are not input directly to the syndrome computing circuit 14, but are input via the spare data replacing circuit 13 to the syndrome computing circuit 14.

The second embodiment is basically the same as the first embodiment, except that, after syndromes are calculated on the basis of data D0, D1, D2, . . . and parity bits P0, P1, P2, . . . read from the memory cell array 11 data SD0, SD1, SD2, . . . read via the spare data replacing circuit 13 from the memory cells in the spare memory cell array 12 are supplied to the syndrome computing circuit 14, thereby recalculating syndromes. In the first syndrome calculation, the data in the memory cell replaced with memory cells in the spare memory cell array 11 is set to 0 and then syndromes are calculated.

Even this configuration produces the same effect as that of the first embodiment.

As in the first embodiment, practically the same configuration as that of the circuit shown in FIGS. 2 to 4 can be applied to the syndrome computing circuit 14 and therefore the concept of the check matrix and syndrome calculations shown in FIGS. 5 and 6 can be used. However, for example, the data read via the spare data replacing circuit 13 from the spare memory cell array 12 is selectively input to the replacing spare data decision circuit 23.

Figure 10:
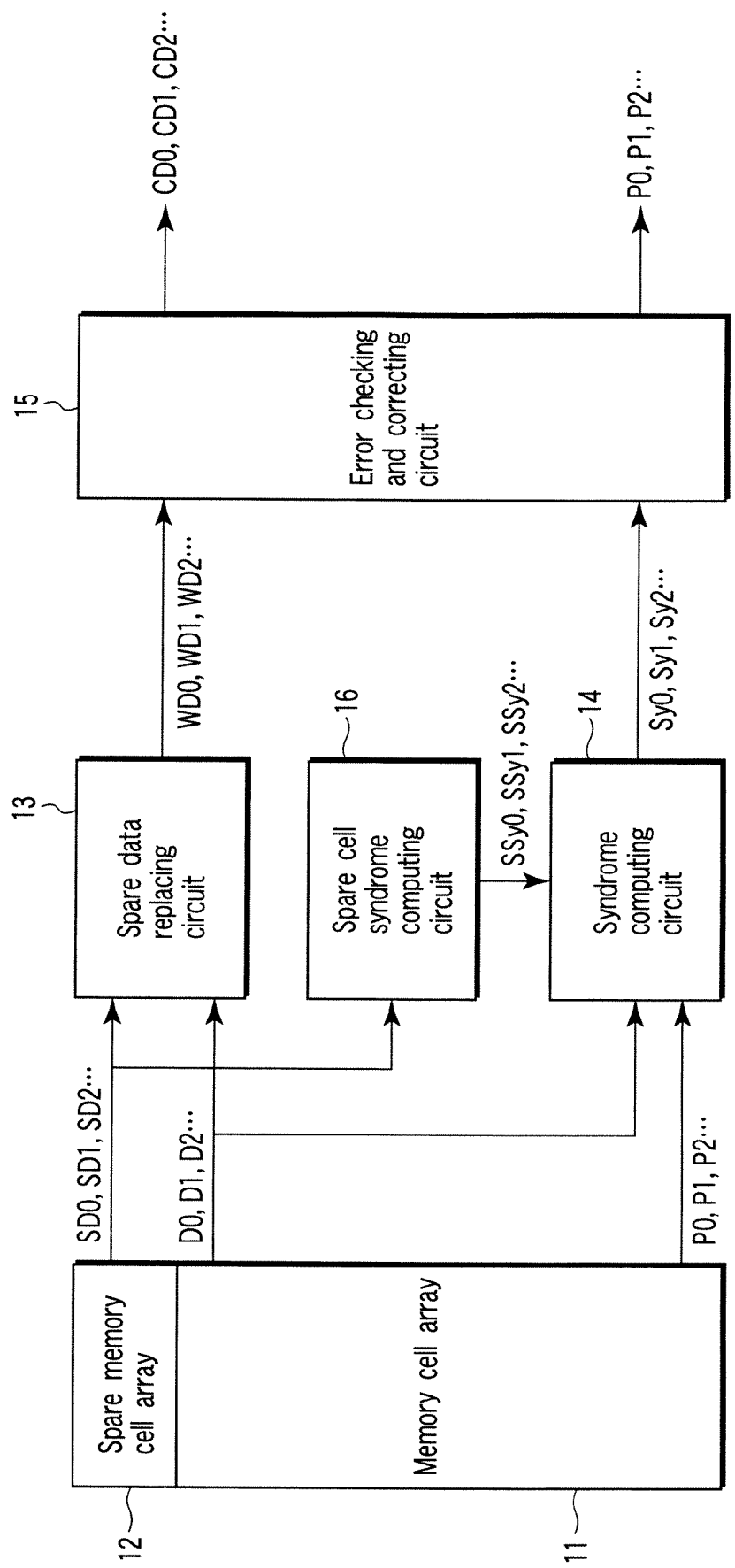
FIG. 10 is a schematic diagram showing an example of the configuration of a part of a ferroelectric memory to help explain a semiconductor memory device according to a third embodiment of the present invention.

FIG. 10 is a schematic diagram showing an example of the configuration of a part of a ferroelectric memory to help explain a semiconductor memory device according to a third embodiment of the present invention. The ferroelectric memory comprises a memory cell array 11, a spare memory cell array 12, a spare data replacing circuit 13, a syndrome computing circuit 14, an error checking and correcting circuit 15, and a spare cell syndrome computing circuit 16.

Data D0, D1, D2, . . . read from the memory cell array 11 and data SD0, SD1, SD2, . . . read from the spare memory cell array 12 are supplied to the spare data replacing circuit 13, thereby carrying out a replacing operation.

Data SD0, SD1, SD2, . . . read from the spare memory cell array 12 are supplied to the spare cell syndrome computing circuit 16, thereby calculating syndromes. Syndromes SSy0, SSy1, SSy2, . . . calculated at the spare cell syndrome computing circuit 16 are supplied to the syndrome computing circuit 14. Data D0, D1, D2, . . . and parity bits P0, P1, P2, . . . read from the memory cell array 1 are also supplied to the syndrome computing circuit 14. The syndrome computing circuit 14 calculates syndromes Sy0, Sy1, . . . from syndromes SSy0, SSy1, . . . , data D0, D1, D2, . . . , and parity bits P0, P1, P2, . . . .

Then, if the error checking and correcting circuit 15 has detected an error from syndromes Sy0, Sy1, Sy2, . . . calculated at the syndrome computing circuit 14 and data WD0, WD1, WD2, . . . replaced by the spare data replacing circuit 13, the error in the data is corrected and the correct data CD0, CD1, CD2, . . . and parity bits P0, P1, P2, . . . are output.

The third embodiment is based on the fact that, when an exclusive OR circuit performs an EXCLUSIVE-OR operation twice, the result of the operation is 0. Instead of setting the data in the memory cell to be replaced in the memory cell array 11 to "0," an EXCLUSIVE-OR operation is performed on the data and then the data to be replaced in the memory cell array is XORed with the data in the spare memory cell array. Performing an EXCLUSIVE-OR operation twice this way makes it possible to cancel the result of the first EXCLUSIVE-OR operation.

The third embodiment is suitable for a case where the bus width of data SD0, SE1, SD2, . . . read from the spare memory cell array 12 is large. Syndromes are calculated using SD0, SD1, SD2, . . . previously read from the spare memory cell array 12. On the basis of the result of the calculation and data D0, D0, D2, . . . read from the memory cells in the memory cell array 11, syndromes are calculated, which enables calculations to be made faster.

As in the first and second embodiments, practically the same configuration as that of the circuit shown in FIGS. 2 to 4 can be applied to the syndrome computing circuit 14 and therefore the concept of the check matrix and syndrome calculations shown in FIGS. 5 and 6 can be used. However, for example, syndromes are selectively input via the spare cell syndrome computing circuit 16 to, for example, the replacing spare data decision circuit 23.

As described above, in the first and second embodiments, syndromes are calculated from the data read from the memory cell array 11 and the data read from the spare memory cell array 12.

A semiconductor memory device according to the first embodiment is such that a ferroelectric memory comprises a memory cell array where a plurality of units are arranged, each unit being such that one end of a ferroelectric capacitor is connected in series with the drain terminal of a transistor whose gate terminal is connected to a word line and whose source terminal is connected to a bit line, the other electrode of the ferroelectric capacitor being connected to a plate line, a spare memory cell array which is for replacing a block including a defective bit in the memory cell array, an ECC circuit which, if an error has occurred in only one bit in a plurality of items of data read from the memory cell array, corrects the error, and a circuit which performs an operation on a data error checking and correcting signal (syndromes) calculated only from the data in the memory cell array, the data read from the spare memory cell array, and the data read from the memory cell in the memory cell array replaced with the spare memory cell array.

In the semiconductor memory device, when the defective bit cell in the memory cell array is replaced with a memory cell in the spare memory cell array, the data error checking and correcting signal (syndromes) calculated only from the data in the memory cell array is subjected to an operation on the data in the spare memory cell.

Furthermore, in the semiconductor memory device, when the defective bit cell in the memory cell array is replaced with a memory cell in the spare memory cell array, the data error checking and correcting signal (syndromes) calculated only from the data in the memory cell array is subjected again to an operation on the data in the spare memory cell to be replaced.

A semiconductor memory device according to another embodiment of the invention is such that a ferroelectric memory comprises a memory cell array where a plurality of units are arranged, each unit being such that one end of a ferroelectric capacitor is connected in series with the drain terminal of a transistor whose gate terminal is connected to a word line and whose source terminal is connected to a bit line, the other electrode of the ferroelectric capacitor being connected to a plate line, a spare memory cell array which is for replacing a block including a defective bit in the memory cell array, an ECC circuit which, if an error has occurred in only one bit in a plurality of items of data read from the memory cell array, corrects the error, and a syndrome generating circuit which outputs a data error checking and correcting signal (syndromes) to the ECC circuit and which calculates syndromes from the data in the memory cell array and the data in the spare memory cell array.

In the semiconductor memory device, the I/O of data in the memory cell array is replaced with the I/O of data in the spare memory cell array in parallel with syndrome calculations done using the data in the memory cell array before the replacement.

The semiconductor memory device further comprises a circuit which replaces the replaced data in the memory cell array necessary for each syndrome operation and the data in the spare memory cell array as a result of the replacement of the I/O of data in the memory cell array with the I/O of data in the spare memory cell array.

A semiconductor memory device according to still another embodiment of the invention is such that a ferroelectric memory comprises a memory cell array where a plurality of units are arranged, each unit being such that one end of a ferroelectric capacitor is connected in series with the drain terminal of a transistor whose gate terminal is connected to a word line and whose source terminal is connected to a bit line, the other electrode of the ferroelectric capacitor being connected to a plate line, a spare memory cell array which is for replacing a block including a defective bit in the memory cell array, an ECC circuit which, if an error has occurred in only one bit in a plurality of items of data read from the memory cell array, corrects the error, an output switching device which switches between the I/O of data in the memory cell array and the I/O of data in the spare memory cell array, and a syndrome generating circuit which outputs a data error checking and correcting signal (syndromes) to the ECC circuit and which calculates syndromes from the data in the spare memory cell array switched by the output switching device and the data in the memory cell array.

In the semiconductor memory device, the I/O of data in the memory cell array is replaced with the I/O of data in the spare memory cell array in parallel with syndrome calculations done using the data in the memory cell array before the replacement.

The semiconductor memory device further comprises a circuit which replaces the replaced data in the memory cell array necessary for each syndrome operation and the data in the spare memory cell array as a result of the replacement of the I/O of data in the memory cell array with the I/O of data in the spare memory cell array.

A semiconductor memory device according to still another embodiment of the invention comprises a memory cell array where a plurality of units are arranged, each unit being such that one end of a ferroelectric capacitor is connected in series with the drain terminal of a transistor whose gate terminal is connected to a word line and whose source terminal is connected to a bit line, the other electrode of the ferroelectric capacitor being connected to a plate line, a spare memory cell array which is for replacing a block including a defective bit in the memory cell array, and an ECC circuit which, if an error has occurred in only one bit in a plurality of items of data read from the memory cell array, corrects the error, wherein a plurality of high bits in a recognition code defining read data and parity data used in a check bit generating circuit and a syndrome generating circuit constituting the ECC circuit are determined in a first period.

A semiconductor memory device according to still another embodiment of the invention is such that a ferroelectric memory comprises a memory cell array where a plurality of units are arranged, each unit being such that one end of a ferroelectric capacitor is connected in series with the drain terminal of a transistor whose gate terminal is connected to a word line and whose source terminal is connected to a bit line, the other electrode of the ferroelectric capacitor being connected to a plate line, a spare memory cell array which is for replacing a block including a defective bit in the memory cell array, an ECC circuit which, if an error has occurred in only one bit in a plurality of items of data read from the memory cell array, corrects the error, and a device which switches the data in the spare memory cell array to the output to I/O to remedy a defective bit in the memory cell array, wherein the syndromes of the data in the spare memory cell array are calculated in advance and the result of the calculation is subjected to an operation on syndromes calculated on the basis of the data in the memory cell array.

As described above in detail, according to an aspect of the present invention, in a ferroelectric memory with a spare memory cell array and an ECC circuit, a defective cell in the memory cell array is replaced with a spare memory cell in parallel with the calculation of a data error checking and correcting signal (syndromes) and the syndromes calculated only from the data in the memory cell array are subjected to an operation on the spare cell data and the cell data replaced with spare cells, which makes it possible to speed up data reading via the ECC circuit.

Accordingly, there is provided a semiconductor memory device which, in a ferroelectric memory with a spare memory cell array and an ECC circuit, makes it possible to replace a defective cell in the memory cell array with a spare memory cell in parallel with the calculation of a data error checking and correcting signal (syndromes) and therefore speed up data reading via the ECC circuit.

While in each of the above embodiments, exclusive OR circuits have been used, a combination of exclusive NOR circuits and inverters may be used in place of exclusive OR circuits. As long as equivalent effects are obtained, other logic circuits, of course, may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
  a memory cell array which includes a plurality of blocks each having memory cells arranged in a matrix and which has a ferroelectric capacitor one electrode of which is connected to a plate line and a transistor whose drain terminal is connected to the other electrode of the ferroelectric capacitor, whose gate terminal is connected to a word line, and whose source terminal is connected to a bit line;

a spare memory cell array which is for replacing a block including a defective bit in the memory cell array;

a syndrome computing circuit which is supplied with redundancy information and is controlled and to which data read from the memory cell array, data read from the spare memory cell array, and parity bits read from the memory cell array are input and which is configured to calculate syndromes;

a spare data replacing circuit which is configured to carry out the operation of replacing the data read from the memory cell array with the data read from the spare memory cell array in parallel with the syndrome calculation; and an error checking and correcting circuit to which the syndromes calculated at the syndrome computing circuit and the data replaced at the spare data replacing circuit are input and which is configured to correct the error if an error has occurred in a plurality of items of data read, wherein the syndrome computing circuit calculates the syndromes of the data read from the memory cell array, replaces the data read from the memory cell array with the data read from the spare memory cell in parallel with the syndrome calculation, and calculates the syndromes of the data read from the memory cell in the spare memory cell array, and when the syndromes of the data read from the memory cell array are calculated at the syndrome computing circuit, an input from the spare data replacing circuit to the error checking and correcting circuit is set to a level uninvolved in the output of the syndrome computing circuit.

2. The semiconductor memory device according to claim 1, wherein the syndrome computing circuit includes a syndrome generating circuit to which the data and parity bits read from the memory cell array are input, a replacing data decision circuit to which the data and parity bits read from the memory cell array and redundancy information are supplied and which outputs replaced data, a replacing spare data decision circuit to which the redundancy information and the data read from the spare memory cell array are supplied and which outputs spare data, and a first exclusive OR circuit to which the output signals of the syndrome generating circuit, the replacing data decision circuit, and the replacing spare data decision circuit are supplied and which outputs syndromes.

3. The semiconductor memory device according to claim 2, wherein the syndrome generating circuit includes a second exclusive OR circuit to which the data and parity bits read from the memory cell array are input.

4. The semiconductor memory device according to claim 2, wherein the replacing data decision circuit includes a plurality of first multiplexers which are controlled by the redundancy information and to which the data and parity bits read from the memory cell array are selectively input, a second multiplexer to which the output signal of the first multiplexer is supplied and which is controlled by the redundancy information, and a second exclusive OR circuit to which the output signal of the second multiplexer is supplied.

5. The semiconductor memory device according to claim 2, wherein the replacing spare data decision circuit includes a plurality of first multiplexers which are controlled by the redundancy information and to which the data read from the spare memory cell array is selectively input and a second exclusive OR circuit to which the output signal of the first multiplexer is supplied.

6. A semiconductor memory device comprising:

a memory cell array which includes a plurality of blocks each having memory cells arranged in a matrix, each memory cell having a ferroelectric capacitor one electrode of which is connected to a plate line and a transistor whose drain terminal is connected to the other electrode of the ferroelectric capacitor, whose gate terminal is connected to a word line, and whose source terminal is connected to a bit line;

a spare memory cell array which is for replacing a block including a defective bit in the memory cell array;

a spare data replacing circuit which is configured to carry out the operation of replacing the data read from the memory cell array with the data read from the spare memory cell array;

a syndrome computing circuit which is supplied with redundancy information and is controlled and to which the data and parity bits read from the memory cell array and the data read via the spare data replacing circuit from the spare memory cell array are input and which is configured to calculate syndromes; and an error checking and correcting circuit to which the syndromes calculated at the syndrome computing circuit and the data replaced at the spare data replacing circuit are input and which is configured to correct the error if an error has occurred in a plurality of items of data read, wherein the syndrome computing circuit calculates the syndromes of the data read from the memory cell array and then recalculate the syndromes of the data read from the memory cell in the spare memory cell array.

7. The semiconductor memory device according to claim 6, wherein the syndrome computing circuit includes a syndrome generating circuit to which the data and parity bits read from the memory cell array are input, a replacing data decision circuit to which the data and parity bits read from the memory cell array and redundancy information are supplied and which outputs replaced data, a replacing spare data decision circuit to which the redundancy information and the data read from the spare memory cell array supplied from the spare data replacing circuit are supplied and which outputs spare data, and a first exclusive OR circuit to which the output signals of the syndrome generating circuit, the replacing data decision circuit, and the replacing spare data decision circuit are supplied and which outputs syndromes.

8. The semiconductor memory device according to claim 7, wherein the syndrome generating circuit includes a second exclusive OR circuit to which the data and parity bits read from the memory cell array are input.

9. The semiconductor memory device according to claim 7, wherein the replacing data decision circuit includes a plurality of first multiplexers which are controlled by the redundancy information and to which the data and parity bits read from the memory cell array are selectively input, a second multiplexer to which the output signal of the first multiplexer is supplied and which is controlled by the redundancy information, and a second exclusive OR circuit to which the output signal of the second multiplexer is supplied.

10. The semiconductor memory device according to claim 7, wherein the replacing spare data decision circuit includes a plurality of first multiplexers which are controlled by the redundancy information and to which the data read from the spare memory cell array supplied from the spare data replacing circuit is selectively input and a second exclusive OR circuit to which the output signal of the first multiplexer is supplied.

11. A semiconductor memory device comprising:

a memory cell array which includes a plurality of blocks each having memory cells arranged in a matrix, each memory cell having a ferroelectric capacitor one electrode of which is connected to a plate line and a transistor whose drain terminal is connected to the other electrode of the ferroelectric capacitor, whose gate terminal is connected to a word line, and whose source terminal is connected to a bit line;

a spare memory cell array which is for replacing a block including a defective bit in the memory cell array;

a spare cell syndrome computing circuit to which the data read from the spare memory cell array is supplied and which is configured to calculate the syndromes of the spare memory cell;

a syndrome computing circuit to which the data and parity bits read from the memory cell array and the syndromes output from the spare cell syndrome computing circuit are input, and which is configured to calculate syndromes;

a spare data replacing circuit which is configured to carry out the operation of replacing the data read from the memory cell array with the data read from the spare memory cell array in parallel with the syndrome calculation; and an error checking and correcting circuit to which the syndromes calculated at the syndrome computing circuit and the data replaced at the spare data replacing circuit are input and which is configured to correct the error if an error has occurred in a plurality of items of data read.

12. The semiconductor memory device according to claim 11, wherein the syndrome computing circuit includes a syndrome generating circuit to which the data and parity bits read from the memory cell array are input, a replacing data decision circuit to which the data and parity bits read from the memory cell array and redundancy information are supplied and which outputs replaced data, a replacing spare data decision circuit to which the redundancy information and the syndromes output from the spare cell syndrome computing circuit are supplied and which outputs spare data, and a first exclusive OR circuit to which the output signals of the syndrome generating circuit, the replacing data decision circuit, and the replacing spare data decision circuit are supplied and which outputs syndromes.

13. The semiconductor memory device according to claim 12, wherein the syndrome generating circuit includes a second exclusive OR circuit to which the data and parity bits read from the memory cell array are input.

14. The semiconductor memory device according to claim 12, wherein the replacing data decision circuit includes a plurality of first multiplexers which are controlled by the redundancy information and to which the data and parity bits read from the memory cell array are selectively input, a second multiplexer to which the output signal of the first multiplexer is supplied and which is controlled by the redundancy information, and a second exclusive OR circuit to which the output signal of the second multiplexer is supplied.

15. The semiconductor memory device according to claim 12, wherein the replacing spare data decision circuit includes a plurality of first multiplexers which are controlled by the redundancy information and to which the syndromes output from the spare cell syndrome computing circuit is selectively input and a second exclusive OR circuit to which the output signal of the first multiplexer is supplied.

* * * * *